(12) United States Patent
Lee et al.

(10) Patent No.: US 6,498,766 B2
(45) Date of Patent: Dec. 24, 2002

(54) INTEGRATED CIRCUIT MEMORY DEVICES THAT UTILIZE INDICATION SIGNALS TO INCREASE RELIABILITY OF READING AND WRITING OPERATIONS AND METHODS OF OPERATING SAME

(75) Inventors: Jae-hyeong Lee, Kyungki-do (KR); Dong-yang Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 13 days.

(21) Appl. No.: 09/862,833

(22) Filed: May 22, 2001

(65) Prior Publication Data

US 2001/0043505 A1 Nov. 22, 2001

(30) Foreign Application Priority Data

May 22, 2000 (KR) .............................................. 00-27504
Nov. 27, 2000 (KR) .............................................. 00-71031

(51) Int. Cl.[7] .................................................. G11C 7/00
(52) U.S. Cl. ..................... 365/233; 365/189.05; 365/193
(58) Field of Search ............................ 365/233, 189.05, 365/193

(56) References Cited

U.S. PATENT DOCUMENTS 6,125,078 A * 9/2000 Ooishi et al. ................. 365/233
6,317,369 B1 * 11/2001 Kubo et al. ................... 365/193

* cited by examiner

*Primary Examiner*—Vu A. Le
(74) *Attorney, Agent, or Firm*—Myers Bigel Sibley & Sajovec

(57) ABSTRACT

Integrated circuit memory devices include a data latch circuit having a data input, a control input and a clock input, and a strobe signal input buffer. The strobe signal input buffer is preferably responsive to a data strobe signal and an indication signal. The strobe signal input buffer operates as a filter by selectively passing an inactive-to-active transition of the data strobe signal to the control input of the data latch when the indication signal is active, while blocking passage of the inactive-to-active transition of the data strobe signal to the control input when the indication signal is inactive. These filtering operations are preferably performed to inhibit the occurrence of data errors when excessive timing skew is present between a system clock and a data strobe signal at a given rate of speed. Accordingly, the operating speeds of memory devices according to embodiments of the present invention may be reliably increased. The data strobe signal and an unbuffered version of the indication signal are preferably generated by a memory controller, which may be operatively coupled to many memory banks within an integrated multi-bank memory system.

35 Claims, 6 Drawing Sheets an integrated circuit memory device can be improved and/or the incidence of errors when reading or writing data to the memory device can be reduced.

INTEGRATED CIRCUIT MEMORY DEVICES THAT UTILIZE INDICATION SIGNALS TO INCREASE RELIABILITY OF READING AND WRITING OPERATIONS AND METHODS OF OPERATING SAME

RELATED APPLICATION

This application claims priority to Korean Application Nos. 2000-27504, filed May 22, 2000, and 2000-71031, filed Nov. 27, 2000, the disclosures of which are hereby incorporated herein by reference.

FIELD OF THE INVENTION

The present invention relates to integrated circuit memory devices and, more particularly, to dynamic random access memory devices and methods of operating same.

BACKGROUND OF THE INVENTION

Semiconductor memory devices such as dynamic random access memory (DRAM) devices have become highly-integrated and operate at higher speed to improve system performance. A synchronous DRAM that operates in-sync with a system clock has been developed for high-speed operation, and data transmission speed has been dramatically increased by advances in synchronous DRAM technology.

However, since data typically must be inputted and outputted in one cycle of the system clock in the synchronous DRAM, there may be limitations when attempting to increase data bandwidth flowing between the synchronous DRAM and a DRAM controller. To address this limitation, dual data rate (DDR) synchronous DRAMs, which input and output data in synchronization with a rising edge and a falling edge of the clock, have been developed to increase data transmission bandwidth. A data strobe signal is typically used in a DDR synchronous DRAM in order to minimize timing margin losses caused by timing skew when reading and writing operations are being performed on DDR DRAMs in systems containing many modules. Timing margin losses may also be caused by process variations, voltage temperature (PVT) variations and differences in propagation delay from a memory controller to each of a plurality of memory modules or from each of the memory modules to the memory controller.

Referring now to FIG. 1, a block diagram of a system using a conventional DDR synchronous DRAM is illustrated. FIG. 2 is a timing diagram illustrating a method for writing data into the conventional DDR synchronous DRAM, and FIG. 3 is a timing diagram illustrating a method for reading data from the conventional DDR synchronous DRAM. Referring to FIGS. 1 and 2, in the system using the conventional DDR synchronous DRAM, a memory controller 11 generates an address ADD and a command signal COM (i.e., a write command signal WT, and a data strobe signal DQS. The memory controller 11 may also generate data DQ to be written into a DDR synchronous DRAM 15 within a module 13.

The DDR synchronous DRAM 15 receives the address ADD and the command signal COM in synchronization with a system clock CK. Next, the DDR synchronous DRAM 15 receives the data strobe signal DQS and the write data DQ, (i.e., D0 and D1). The data DQ is then stored in the DRAM 15 in response to a transition of the data strobe signal DQS from a logic 0 level (inactive) to a logic 1 level (active).

Referring now to FIGS. 1 and 3, the memory controller 11 generates the address ADD and the command signal COM (i.e., a read command signal RD), when data is to be read from the DDR synchronous DRAM 15. The DDR synchronous DRAM 15 receives the address ADD and the command signal COM in synchronization with the system clock CK and provides the data strobe signal DQS and the read data DQ (shown as D0 and D1).

The memory controller 11 receives the data strobe signal DQS and the data DQ from the DDR synchronous DRAM 15, during a read operation. The data DQ is received and latched by the controller 11 in response to a transition of the data strobe signal DQS from a logic 0 level to a logic 1 level.

However, in the conventional DDR synchronous DRAM, in order to write data at a desired rate into a memory cell during a write operation, JEDEC standards between the system clock CK and the data strobe signal DQS must be met. As shown in the input timing diagram of FIG. 2, the maximum skew between the system clock CK and the data strobe signal DQS is ¼ of $t_{CK}$, where $t_{CK}$ denotes the period of the system clock CK. Accordingly, an interval DQSWIN between a minimum time tDQSS (min) when the data strobe signal DQS is toggled during a write operation and a maximum time tDQSS (max) when the data strobe signal DQS is toggled is ½ of $t_{CK}$.

Here, tDQSS (min) denotes the earliest time when the data strobe signal DQS reaches the DDR synchronous DRAM 15, measured from an edge of the system clock CK that occurs during an active period of the write command signal WT. tDQSS (max) denotes the latest time when the data strobe signal DQS reaches the DDR synchronous DRAM 15, measured from the edge of the system clock CK. As will be understood by those skilled in the art, tIS and tIH denote a setup time and a hold time of the write command signal WT and tDS and tDH denote a setup time and a hold time of the data DQ.

However, when the frequency of the system clock CK is increased (e.g., when the frequency of the system clock CK is increased to higher than 400 MHz (tCK=2.5 ns)), it may be difficult to manage the timing of the data strobe signal DQS so that the skew between the system clock CK and the data strobe signal DQS is ¼ of $t_{CK}$ (e.g., less than 0.625 ns). Thus, as the data transmission speed is increased in response to higher clock frequencies, it may become more difficult to input valid data during the desired cycle of the system clock CK. Thus, notwithstanding higher data rates that can be achieved using DDR synchronous DRAMs, there continues to be a need for DRAMs that can handle skews greater than ½ $t_{CK}$.

SUMMARY OF THE INVENTION

Integrated circuit memory devices according to a first embodiment of the present invention include a data latch having a data input, a control input and a clock input, and a strobe signal input buffer. The strobe signal input buffer is preferably responsive to a data strobe signal and an indication signal. The strobe signal input buffer operates as a filter by selectively passing an inactive-to-active transition of the data strobe signal to the control input of the data latch when the indication signal is active, while blocking passage of the inactive-to-active transition of the data strobe signal to the control input when the indication signal is inactive. These filtering operations are preferably performed to inhibit the occurrence of data errors when excessive timing skew is present between a system clock and a data strobe signal at a given rate of speed. Accordingly, the operating speeds of memory devices according to embodiments of the present invention may be reliably increased. The data strobe signal and an unbuffered version of the indication signal are preferably generated by a memory controller, which may be operatively coupled to many memory banks within an integrated multi-bank memory system.

A multi-bank memory device according to a second embodiment of the present invention includes a synchronous dynamic random access memory (SDRAM) device. The SDRAM device preferably comprises a data latch circuit having a data input, a control input and a clock input. A strobe signal input buffer is also provided. This strobe signal input buffer is responsive to a data strobe signal and an indication signal. The strobe signal input buffer selectively passes an inactive-to-active transition of the data strobe signal to the control input of the data latch when the indication signal is active. Alternatively, the strobe signal input buffer blocks passage of the inactive-to-active transition of the data strobe signal to the control input when the indication signal is inactive. This blocking function is performed independent of the degree of timing skew between the system clock and the data strobe signal. The SDRAM device may also comprise a data input buffer having an output electrically coupled to an input of the data latch circuit.

A memory controller may also be provided to generate the data strobe signal and a data output of the memory controller may be communicatively coupled to an input of the data input buffer within the SDRAM device. The memory controller may also generate a pre-buffered indication signal and the SDRAM device may comprise an indication signal input buffer having an input that is responsive to the pre-buffered indication signal and an output at which the indication signal is generated as a time delayed version of the pre-buffered indication signal.

According to still another embodiment of the present invention, a multi-bank memory system is provided that comprises a memory controller and a memory device. The memory controller generates a data strobe signal and an indication signal. The memory device comprises a data latch circuit having a data input and a control input and an indication signal input buffer that generates a buffered indication signal in response to the indication signal. A preferred strobe signal input buffer is also provided. The strobe signal input buffer, which is responsive to the data strobe signal and the buffered indication signal, provides the control input of the data latch with a buffered version of the data strobe signal when the buffered indication signal is active. However, when the buffered indication signal is inactive, the strobe signal input buffer blocks generation of the buffered version of the data strobe signal.

Preferred methods of operating an integrated circuit memory devices also comprise the steps of generating data and an inactive-to-active transition of a data strobe signal in-sync with a clock signal. An indication signal is also generated. This indication signal has an inactive-to-active transition that precedes the inactive-to-active transition of the data strobe signal and an active-to-inactive transition that follows the inactive-to-active transition of the data strobe signal. According to a preferred aspect of these methods, a buffered data strobe signal is preferably generated as an inverted or non-inverted version of the data strobe signal when the transition signal is active and as an inactive signal, which is not a function of a state of the data strobe signal, when the transition signal is inactive.

DESCRIPTION OF PREFERRED EMBODIMENTS

Figure 1:
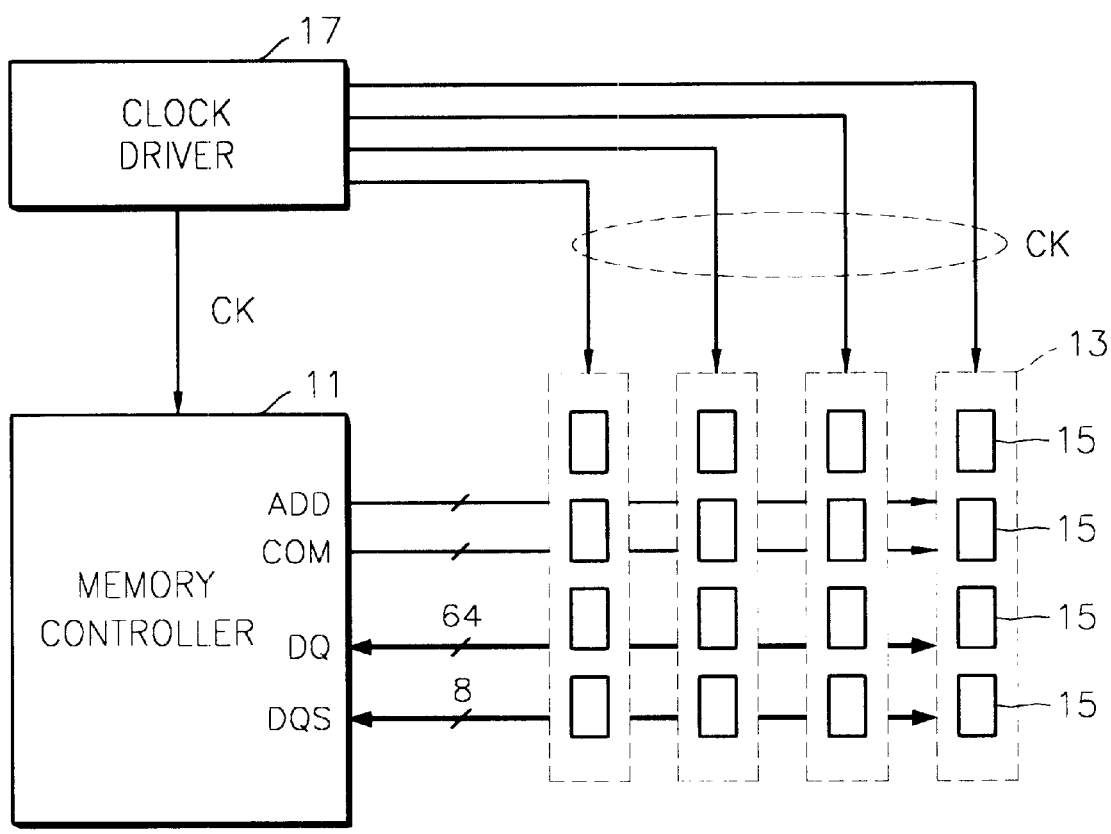
FIG. 1 is a block diagram of a system using a conventional DDR synchronous DRAM.
Figure 2:
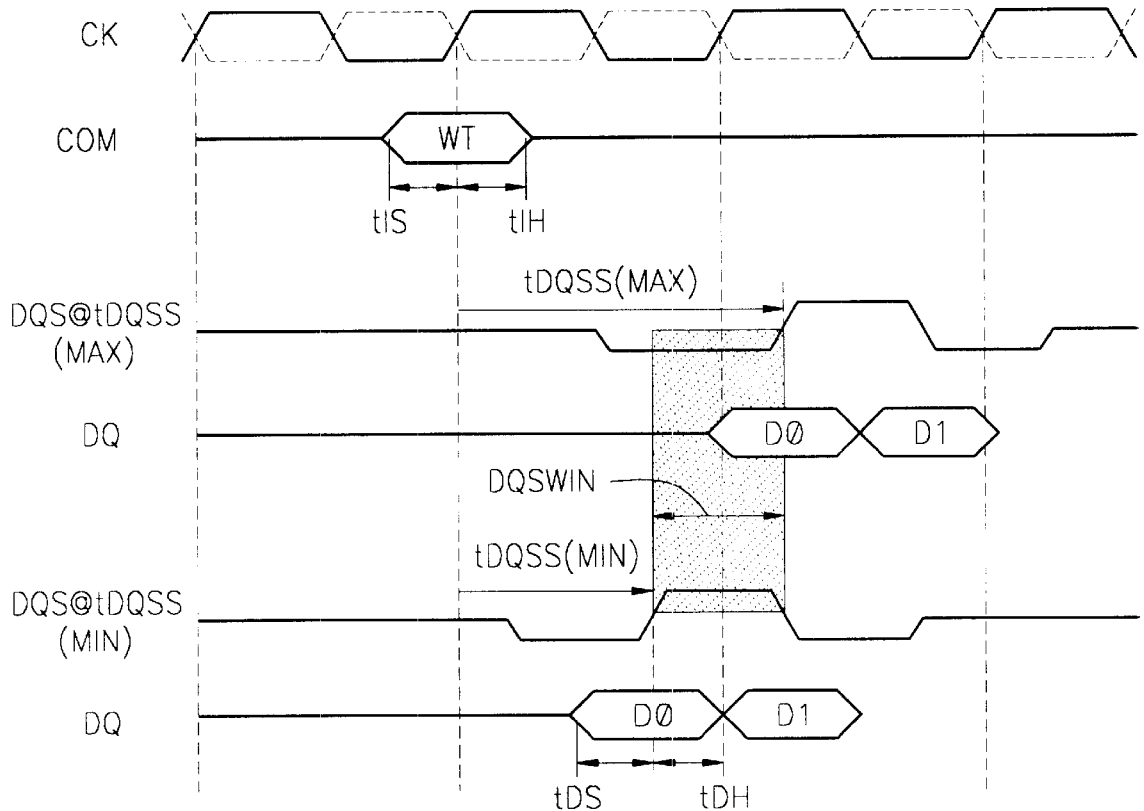
FIG. 2 is a timing diagram illustrating a conventional method for writing data into a conventional DDR synchronous DRAM.
Figure 3:
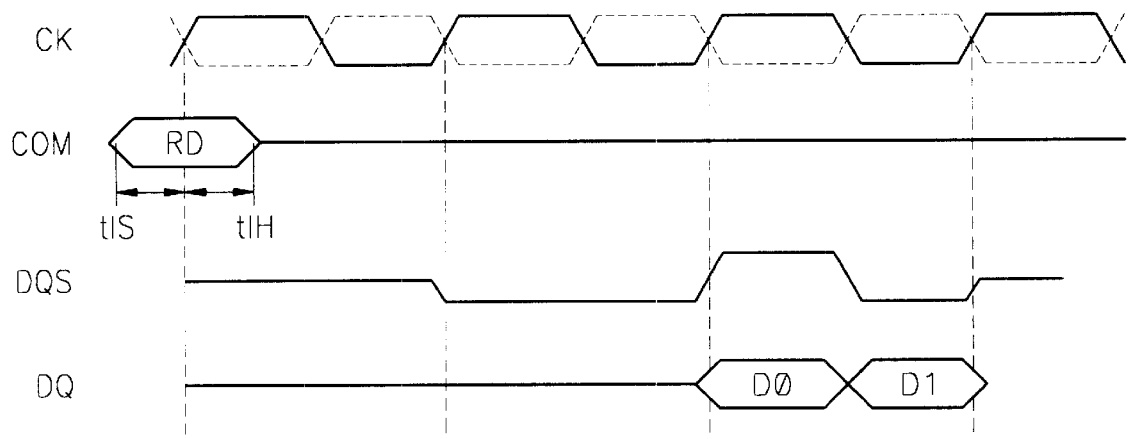
FIG. 3 is a timing diagram illustrating a conventional method for reading data from a conventional DDR synchronous DRAM.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Signal lines and signals thereon may be referred to by the same reference characters. Like numbers refer to like elements throughout. Numeric values for various components of the preferred embodiments are also provided for purposes of illustration only and should not be used to limit the scope of the illustrated embodiments or claims.

Figure 4:
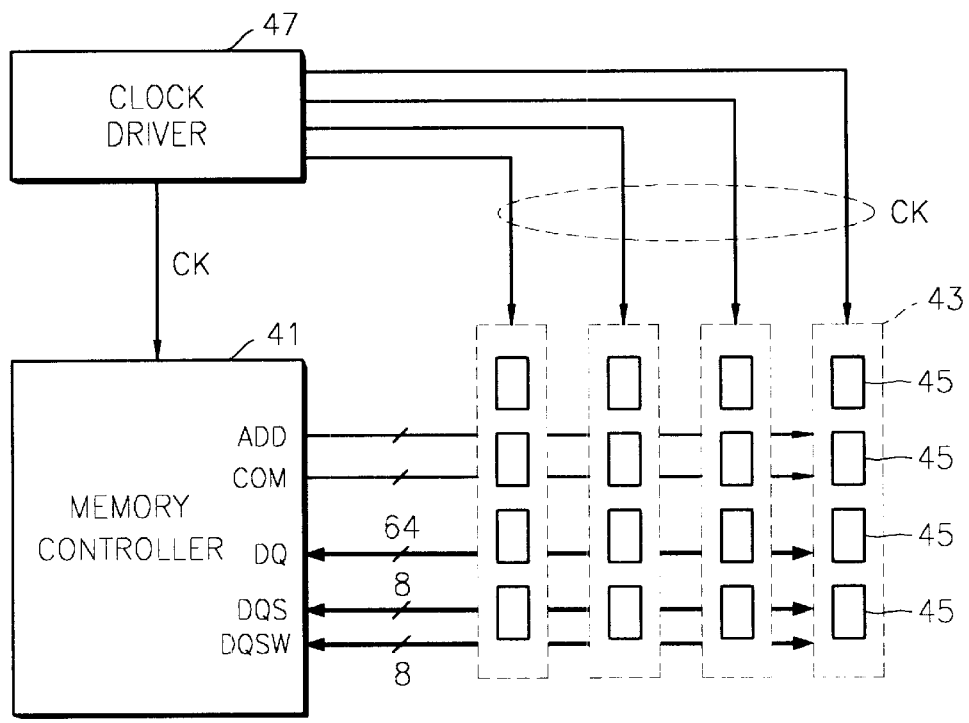
FIG. 4 is a block diagram of a system including a memory controller and DDR synchronous DRAM according to an embodiment of the present invention.
Figure 5:
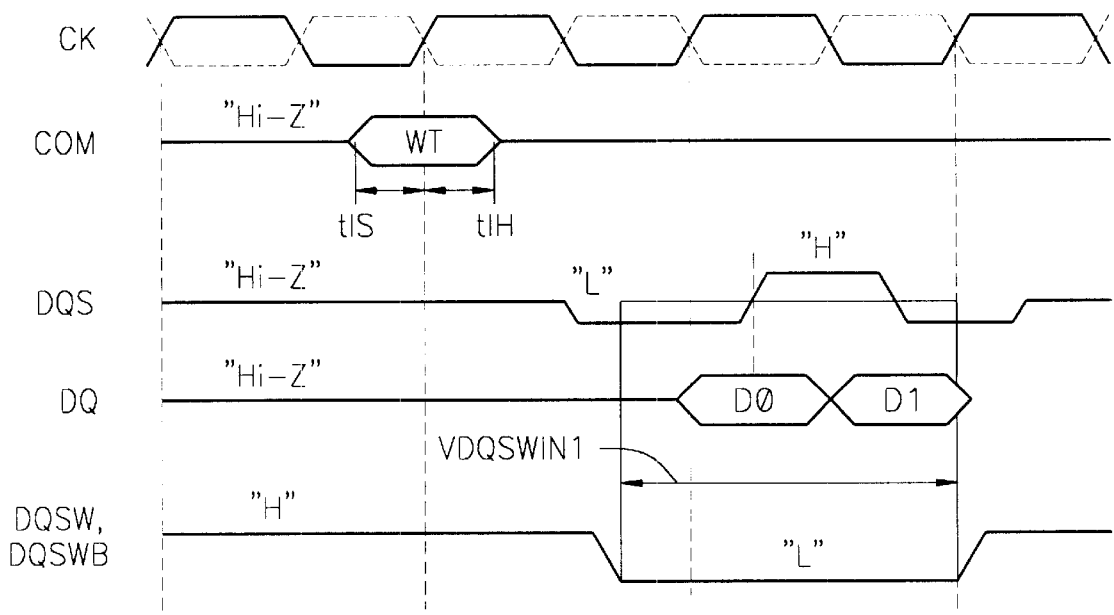
FIG. 5 is a timing diagram illustrating a method for writing data into a DDR synchronous DRAM according to an embodiment of the present invention.
Figure 6:
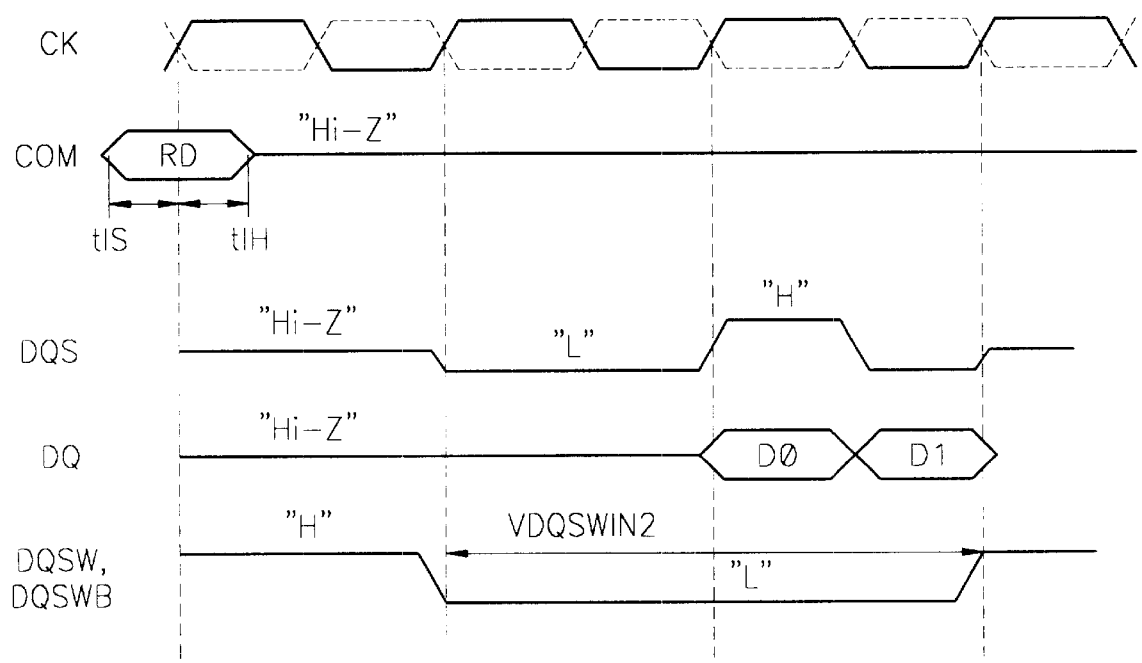
FIG. 6 is a timing diagram illustrating a method for reading data from a DDR synchronous DRAM according to an embodiment of the present invention.

FIG. 4 is a block diagram of a system using a DDR synchronous DRAM according to an embodiment of the present invention, and FIG. 5 is a timing diagram illustrating a, preferred method for writing data into the DDR synchronous DRAM. In addition, FIG. 6 is a timing diagram illustrating a preferred method for reading data from the DDR synchronous DRAM, operating with a column address strobe (CAS) latency of 2 and a burst length (BL) of 2. In FIGS. 5 and 6, "Hi-Z" denotes a high-impedance state, H denotes logic "high" and L denotes a logic "low".

Referring now to FIGS. 4 and 5, in the system using a DDR synchronous DRAM 45 according to an embodiment of the present invention, a memory controller 41 generates a write address ADD, a command signal COM (shown as a write command signal WT), a data strobe signal DQS and write data DQ. These signals and data may be provided to a DDR synchronous DRAM 45 within a module 43. According to a preferred aspect of the present invention, the memory controller also generates an indication signal DQSW in an active state (e.g., logic 0=L) when write data DQ (shown as D0 and D1) is being provided to the DDR synchronous DRAM 45.

The indication signal DQSW, which is preferably generated by the memory controller 41 during a write operation, is active during the interval VDQSWIN1, as shown by the timing diagram of FIG. 5. In this case, the indication signal DQSW can be treated as a "window" signal that indicates when the data DQ is valid. The time interval from when the activation of the indication signal DQSW occurs to the first valid data D0 and the time interval from the last valid data D1 to the deactivation of the indication signal DQSW are variable depending on a target frequency of the system clock CK.

Here, the point of activation of the indication signal DQSW is the point when the indication signal DQSW transitions from logic "high" to logic "low". The point of deactivation of the indication signal DQSW is the point in time when the indication signal DQSW transitions from logic "low" to logic "high". The data strobe signal DQS is toggled within the activation interval VDQSWIN1 of the indication signal DQSW. In FIG. 5, the indication signal DQSW is shown as being deactivated after the last valid data D1. However, to improve the efficiency of a system bus, the indication signal DQSW may be deactivated before the last valid data D1 or, more preferably, simultaneously with the last valid data D1. According to a preferred aspect of this embodiment of a memory system, the indication signal DQSW is activated simultaneously with the first valid data D0 and deactivated simultaneously with the last valid data D1.

Referring still to FIG. 5, the DDR synchronous DRAM 45 receives the address ADD and the command signal COM (shown as a write command signal WT), in synchronization with the system clock CK generated by a clock driver 47. The DDR synchronous DRAM 45 also receives the data strobe signal DQS, the data DQ (shown as D0 and D1) and the indication signal DQSW. Here, the DDR synchronous DRAM 45 receives the write data DQ in response to a low-to-high toggling of the data strobe signal DQS and stores the data DQ in an internal memory cell array. The timing diagram of FIG. 5 shows an example of writing two data words D0 and D1 into the memory cell array, however, different quantities of data may also be provided.

Referring now to FIGS. 4 and 6, the memory controller 41 generates a read address ADD and a command signal COM (shown as a read command signal RD) during a read operation from the DDR synchronous DRAM 45 within the module 43. In response, the DDR synchronous DRAM generates the data strobe signal DQS and the read data DQ. The read timing diagram of FIG. 6 shows an example where two data words D0 and D1 are read from the DRAM 45. This may occur when the burst length (BL) equals two (2). During a read operation, the DDR synchronous DRAM 45 generates the indication signal DQSW. In particular, the DDR synchronous DRAM 45 outputs the data strobe signal DQS and the read data DQ (i.e., D0 and D1) and the indication'signal DQSW in response to an internal clock that can be generated from the system clock CK.

As shown in the output timing diagram of FIG. 6, the indication signal DQSW is activated during a predetermined interval VDQSWIN2. During this interval valid data D0 and D1 are output from the DDR synchronous DRAM 45. In this instance, the indication signal DQSW operates as a window signal that can be used to control the latching of the read data DQ by a device (e.g., memory controller 41) coupled to the DRAM 45. The time interval from the activation of the indication signal DQSW to the first valid data D0 and the time interval from the last valid data D1 to the deactivation of the indication signal DQSW are variable according to a target frequency of the system clock CK.

As illustrated by FIG. 6, activation of the indication signal DQSW occurs when the indication signal DQSW transitions from a logic "high" level to a logic "low" level. Deactivation of the indication signal DQSW occurs when the indication signal DQSW transitions from a logic "low" level to a logic "high" level. The data strobe signal DQS is also toggled within the activation interval VDQSWIN2 of the indication signal DQSW. In the output timing diagram of FIG. 6, the indication signal DQSW is deactivated after the last valid data D1 is generated. To improve the efficiency of a bus in the system, the indication signal DQSW may be deactivated before the last valid data D1 is generated. More preferably, the indication signal DQSW is made active simultaneously with the first valid data D0 and is then made inactive simultaneously with the last valid data D1.

During the read operation, the memory controller 41 receives the indication signal DQSW from the DDR synchronous DRAM 45 and receives the data strobe signal DQS and the data DQ (i.e., D0 and D1) in response to the indication signal DQSW. The memory controller 41 inputs and latches the data DQ in response to toggling of the data strobe signal DQS (i.e., transition of DQS from "0" to "1").

According to a preferred aspect of this embodiment, the validity of the data DQ provided during a read operation can be essentially guaranteed by using the indication signal DQSW to control timing of when the data DQ is latched by the memory controller 41. Accordingly, even if the timing skew between the system clock CK and the data strobe signal DQS varies in response to changes in clock frequency, the accuracy of the writing and reading operations can be improved by using indication signals as described herein.

Figure 7:
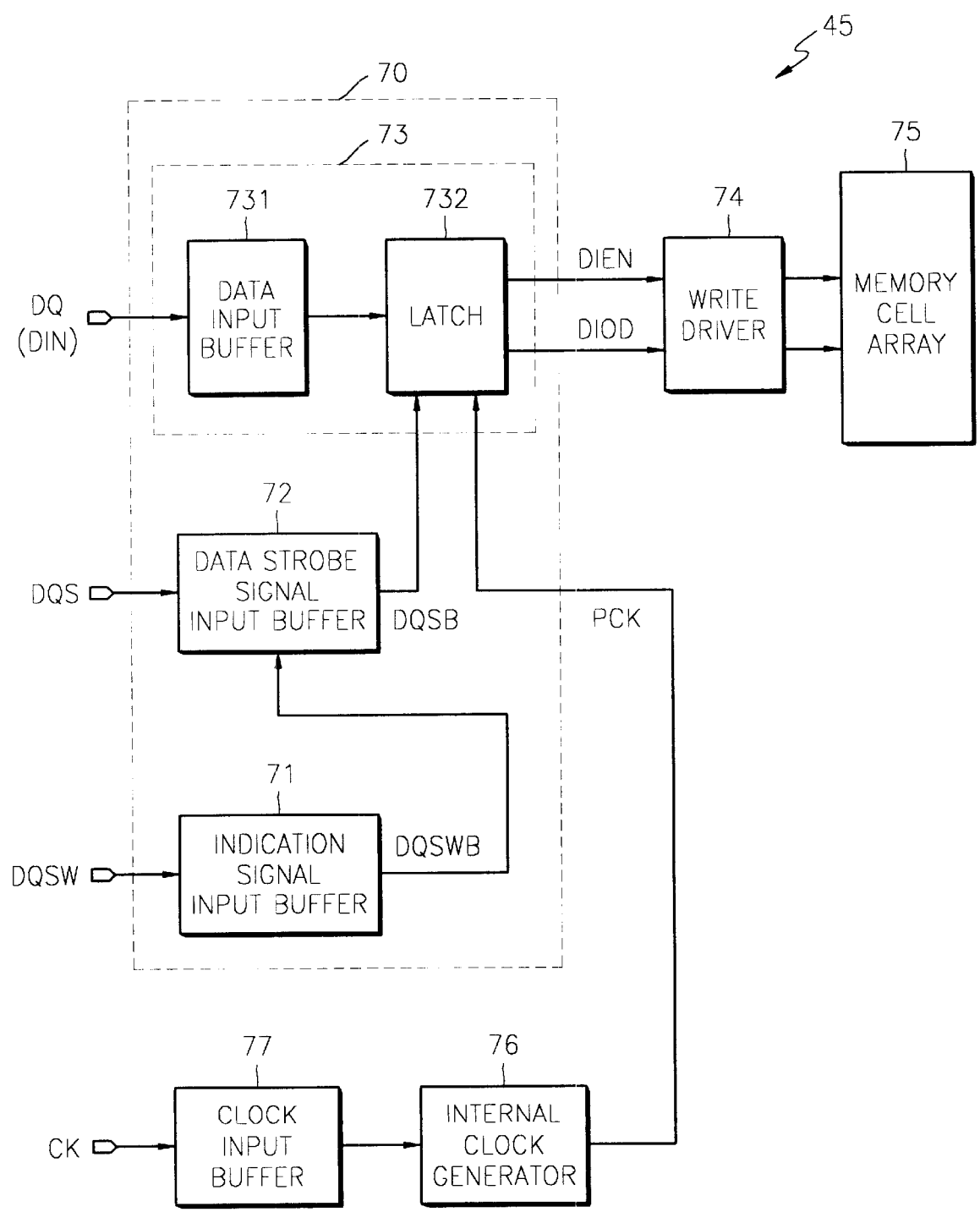
FIG. 7 is a circuit for writing data into a DDR synchronous DRAM according to an embodiment of the present invention.

Referring now to FIGS. 4–5 and 7, a circuit 70 for writing data into a memory cell array 75 within a synchronous DRAM 45 will be described. The circuit 70 includes an indication signal input buffer 71, a data strobe signal input buffer 72, and a data input and latch circuit 73. As illustrated, the indication signal input buffer 71 receives an indication signal DQSW, which indicates that write data DQ is to be transmitted. The indication signal input buffer 71 buffers the received indication signal, and outputs a buffered indication signal DQSWB. For purposes of illustration only, there is no time delay illustrated between the buffered indication signal DQSWB and the received indication signal DQSW. It will be understood, however, that the indication signal input buffer 71 provides a non-zero delay (and preferably non-inverting function) and that the timing of VDQSWIN1 and VDQSWIN2 in FIGS. 5–6 is based on the buffered indication signal DQSWB. The data strobe signal input buffer 72 receives a data strobe signal DQS and outputs a buffered data strobe signal DQSB. However, the buffered data strobe signal DQSB is only output if the data strobe signal DQS transitions from an inactive level (e.g., "low") to an active level (e.g., "high") while the buffered indication signal DQSWB is in an active state (e.g., "low").

The data input and latch circuit 73 includes a data input buffer 731 and a latch 732. The data input buffer 731 receives and buffers the write data DQ (shown as DIN). The latch 732 latches the buffered write data DQ in response to toggling of the buffered data strobe signal DQSB. The latch circuit 732 also outputs even data DIEN and odd data DIOD in response to the internal clock PCK.

The odd write data DIOD and the even write data DIEN, which are generated at the output of the latch 732, are stored in a memory cell array 75. A write driver circuit 74 may drive the bit lines of the memory cell array 75 using conventional techniques. The internal clock PCK is generated by an internal clock generator 76. A clock input buffer 77 receives a system clock CK. The internal clock generator 76 receives a clock signal output from the clock input buffer 77, and generates the internal clock PCK as a delayed version of the clock signal generated at the output of the clock input buffer 77.

As described herein, during a write operation, the indication signal DQSW, the data strobe signal DQS, and the data DQ are received from the memory controller 41 of FIG. 4, and the system clock CK is received from the clock driver 47 of FIG. 4. The clock driver 47 may be included in the memory controller 41 or another integrated circuit.

Figure 8:
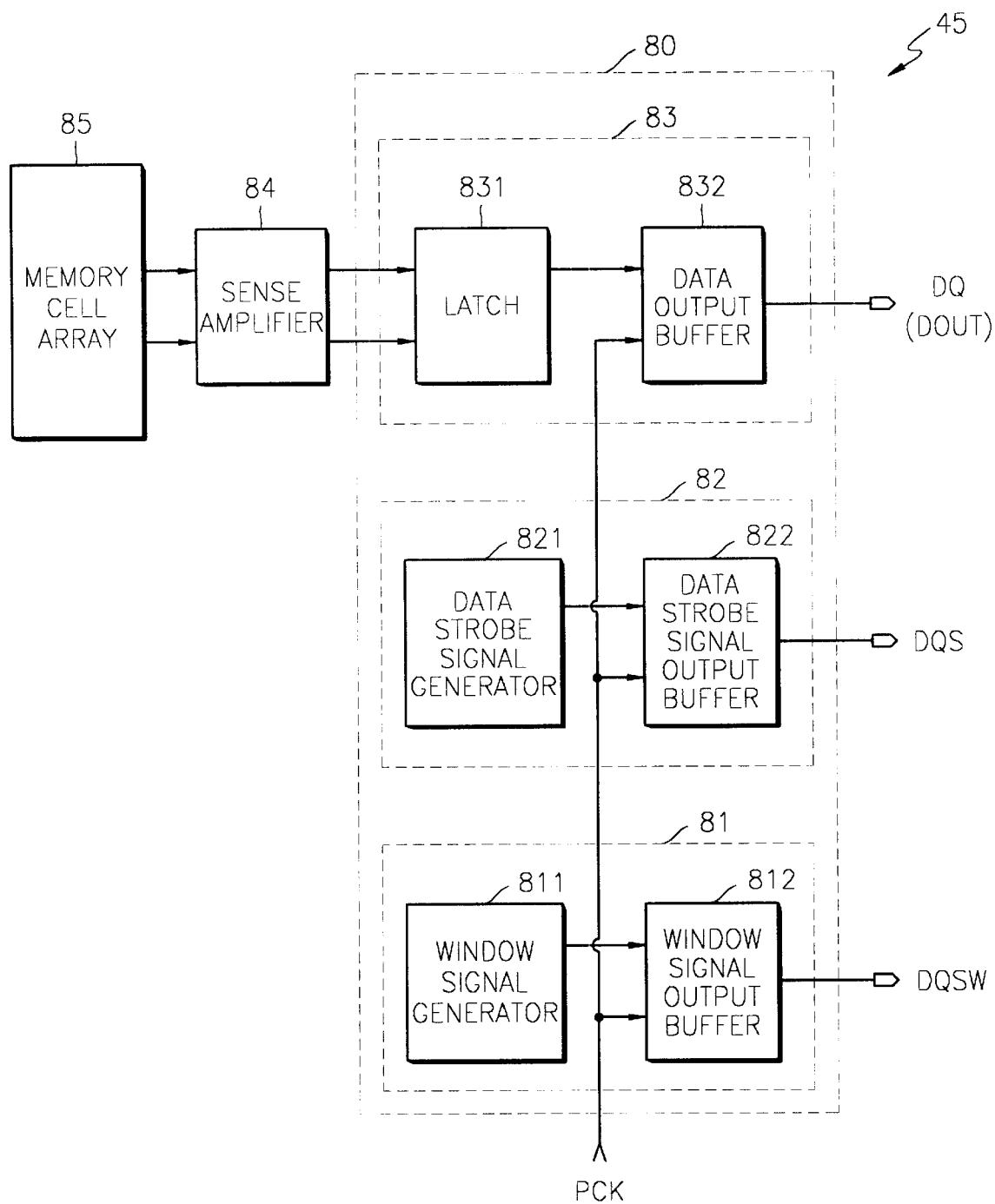
FIG. 8 is a circuit for reading data from a DDR synchronous DRAM according to an embodiment of the present invention.

FIG. 8 illustrates a circuit 80 for outputting data in the DDR synchronous DRAM 45, according to an embodiment of the present invention. The circuit 80 for outputting data includes an indication signal generating and outputting circuit 81, a data strobe signal generating and outputting circuit 82, and a data latching and outputting circuit 83 that provides the read data DQ (shown as DOUT). The indication signal generating and outputting circuit 81 includes an indication signal generator circuit 811 and an indication signal output buffer circuit 812. The indication signal output buffer 812 is responsive to the output of the indication signal generator circuit 811 and an internal clock signal PCK. The data strobe signal generating and outputting circuit 82 generates a data strobe signal DQS in response to the internal clock PCK. The data strobe signal generating and outputting circuit 82 includes a data strobe signal generator circuit 821 and a data strobe signal output buffer circuit 822. The data latching and outputting circuit 83 latches read data that passes from a memory cell array 85 and through a sense amplifier circuit 84. The data latching and outputting circuit 83 synchronizes the read data DQ with the data strobe signal DQS and outputs the read data DQ. The data latching and outputting circuit 83 includes a latch circuit 831 and a data output buffer circuit 832 that is responsive to the internal clock PCK.

During a read operation, the indication signal DQSW, the data strobe signal DQS, and the read data DQ are transmitted to the memory controller 41 of FIG. 4, and the system clock CK is received from the clock driver 47 of FIG. 4. The memory controller 41 may contain circuitry similar to that shown by FIG. 7, including a circuit for buffering the indicator signal DQSW and generating a buffered indication signal DQSWB. As described above with respect to the write operations, the reliability of generating valid read data DQ (e.g., D0 and D1), is enhanced by using the indication signal DQSW to control acceptance of the read data DQ by the memory controller 41. Accordingly, even if the frequency of the system clock CK is increased, the data transmission speed is increased and the timing skew between the data strobe signal and the data is varied, valid data can be preserved by making the acceptance of the valid data a function of the state (active v. inactive) of the indication signal when the data strobe signal transitions from an inactive state (e.g., "low") to an active state (e.g., "high").

Thus, as described above, an integrated circuit memory device according to one embodiment of the present invention includes a data latch 732 having a data input, a control input and a clock input, and a strobe signal input buffer 72. The strobe signal input buffer 72 is preferably responsive to a data strobe signal DQS and an indication signal DQSWB. The strobe signal input.buffer 72 operates as a filter by selectively passing an inactive-to-active transition of the data strobe signal DQS to the control input of the data latch 732 when the indication signal DQSWB is active, while blocking passage of the inactive-to-active transition of the data strobe signal DQS to the control input when the indication signal DQSWB is inactive. These devices and operations may be performed within the SDRAM 45, for example, during a write operation, or within the memory controller 41 during a read operation. These filtering operations are preferably performed to inhibit the occurrence of data errors when excessive timing skew is present between a system clock and a data strobe signal at a given rate of speed. During a write operation, the data strobe signal DQS and an unbuffered version of the indication signal (e.g., DQSW) are preferably generated by the memory controller 41, which may be operatively coupled to many memory banks within an integrated multi-bank memory system.

According to yet another embodiment of the present invention, a multi-bank memory device includes a synchronous dynamic random access memory (SDRAM) device. The SDRAM device preferably comprises a data latch 732 having a data input, a control input and a clock input. A strobe signal input buffer 72 is also provided. This strobe signal input buffer 72 is responsive to a data strobe signal DQS and an indication signal DQSWB (e.g., a buffered indication signal). The strobe signal input buffer 72 selectively passes an inactive-to-active transition (e.g., low-to-high transition) of the data strobe signal DQS to the control input of the data latch 732 when the indication signal DQSWB is active. Alternatively, the strobe signal input buffer 72 blocks passage of the inactive-to-active transition of the data strobe signal DQS to the control input when the indication signal DQSWB is inactive. The strobe signal input buffer preferably comprises a non-inverting buffer that drives its output to an inactive level when the indication signal DQSWB is at an inactive level. This blocking function may be performed independent of the degree of timing skew between the system clock and the data strobe signal.

The SDRAM device 45 may also comprise a data input buffer 731 having an output electrically coupled to an input of the data latch 732. A memory controller 41 may also be provided to generate the data strobe signal DQS and a data output of the memory controller 41 may be communicatively coupled to an input of the data input buffer 731 within the SDRAM device 45. The memory controller 41 may also generate a pre-buffered indication signal DQSW and the SDRAM device 45 may comprise an indication signal input buffer 71 having an input that is responsive to the pre-buffered indication signal DQSW and an output at which the indication signal DQSWB is generated as a time delayed version of the pre-buffered indication signal DQSW. The memory controller 41 may also comprise the circuitry illustrated by Block 70, so that the above-described operations may be performed within the memory controller 41 during a reading operation (i.e., when the SDRAM device 45 is outputting data (DOUT), the data strobe signal DQS and an indication signal DQSW).

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device, comprising:
   a data latch having a data input, a control input and a clock input; and
   a strobe signal input buffer that is responsive to a data strobe signal and an indication signal and selectively passes an inactive-to-active transition of the data strobe signal to the control input of said data latch when the indication signal is active, but blocks passage of the inactive-to-active transition of the data strobe signal to the control input when the indication signal is inactive.

2. The memory device of claim 1, further comprising:
a memory controller that generates the data strobe signal and a pre-buffered version of the indication signal.

3. The memory device of claim 2, further comprising:
a memory cell array; and
a write driver having at least one input electrically coupled to said data latch and an output electrically coupled to said memory cell array.

4. A multi-bank memory device, comprising:
a synchronous dynamic random access memory (SDRAM) device, said SDRAM device comprising:
  a data latch having a data input, a control input and a clock input; and
  a strobe signal input buffer that is responsive to a data strobe signal and an indication signal and selectively passes an inactive-to-active transition of the data strobe signal to the control input of said data latch when the indication signal is active, but blocks passage of the inactive-to-active transition of the data strobe signal to the control input when the indication signal is inactive; and
  a memory controller that generates the data strobe signal.

5. The memory device of claim 4, wherein said SDRAM device comprises a data input buffer having an output electrically coupled to an input of the data latch; and wherein a data output of said memory controller is communicatively coupled to an input of the data input buffer within said SDRAM device.

6. The memory device of claim 4, wherein said memory controller generates a pre-buffered indication signal; wherein said SDRAM device comprises an indication signal input buffer having an input that is responsive to the pre-buffered indication signal; and wherein the indication signal input buffer generates the indication signal as a time delayed version of the pre-buffered indication signal.

7. A multi-bank memory system, comprising:
a memory controller that generates a data strobe signal and an indication signal; and
a memory device, said memory device comprising:
  a data latch having a data input and a control input;
  an indication signal input buffer that generates a buffered indication signal in response to the indication signal; and
  a strobe signal input buffer that is responsive to the data strobe signal and the buffered indication signal and provides the control input of the data latch with a buffered version of the data strobe signal when the buffered indication signal is active, but blocks generation of the buffered version of the data strobe signal when the buffered indication signal is inactive.

8. A method of operating an integrated circuit memory device, comprising the steps of:
generating an inactive-to-active transition of a data strobe signal in-sync with a clock signal;
generating data in-sync with the clock signal;
generating an indication signal having an inactive-to-active transition that precedes the inactive-to-active transition of the data strobe signal and an active-to-inactive transition that follows the inactive-to-active transition of the data strobe signal;
selectively generating a buffered data strobe signal as an inverted or non-inverted version of the data strobe signal when the indication signal is active and as an inactive signal that is not a function of a state of the data strobe signal when the indication signal is inactive; and
latching the data in-sync with an inactive-to-active transition of the buffered data strobe signal.

9. A method for writing data into a synchronous semiconductor memory device, the method comprising the steps of:
receiving an indication signal for indicating data transmission;
receiving a data strobe signal in response to the indication signal; and
inputting and latching the data in response to toggling of the data strobe signal.

10. The method according to claim 9, wherein the indication signal is activated during a predetermined interval including a valid interval of the data.

11. The method according to claim 10, wherein the data strobe signal is toggled within an activation interval of the indication signal.

12. The method according to claim 9, wherein the indication signal is at latest activated simultaneously with a first valid data of the data and is at latest deactivated simultaneously with a last valid data of the data.

13. The method according to claim 9, wherein the indication signal and the data strobe signal are generated from a memory controller for controlling the semiconductor memory device.

14. A method for reading data from a synchronous semiconductor memory device, the method comprising the steps of:
generating and outputting an indication signal for indicating output of data;
generating and outputting a data strobe signal; and
synchronizing the data with the data strobe signal and outputting the data.

15. The method according to claim 14, wherein the indication signal is activated during a predetermined interval including a valid interval of the data.

16. The method according to claim 15, wherein the data strobe signal is toggled within an activation interval of the indication signal.

17. The method according to claim 14, wherein the indication signal is at latest activated simultaneously with a first valid data of the data and is at latest deactivated simultaneously with a last valid data of the data.

18. The method according to claim 14, wherein the indication signal, the data strobe signal, and the data are transmitted to a memory controller for controlling the semiconductor memory device.

19. A circuit for writing data into a synchronous semiconductor memory device, the circuit comprising:
an indication signal input buffer circuit for receiving an indication signal for indicating data transmission;
a data strobe signal input buffer circuit for receiving a data strobe signal in response to an output signal of the indication signal input buffer circuit; and
a data input latch circuit for inputting and latching the data in response to toggling of an output signal of the data strobe signal input buffer circuit.

20. The circuit according to claim 19, wherein the indication signal is activated during a predetermined interval including a valid interval of the data.

21. The circuit according to claim 20, wherein the data strobe signal is toggled within an activation interval of the indication signal.

22. The circuit according to claim 19, wherein the indication signal is at latest activated simultaneously with a first valid data of the data and is at latest deactivated simultaneously with a last valid data of the data.

23. The circuit according to claim 19, wherein the indication signal and the data strobe signal are generated from a memory controller for controlling the semiconductor memory device.

24. A circuit for reading data from a synchronous semiconductor memory device, the circuit comprising:

an indication signal generating and outputting circuit for generating and outputting an indication signal for indicating output of data;

a data strobe signal generating and outputting circuit for generating and outputting a data strobe signal; and a data latching and outputting circuit for synchronizing the data with the data strobe signal and outputting the data.

25. The circuit according to claim 24, wherein the indication signal is activated during a predetermined interval including a valid interval of the data.

26. The circuit according to claim 25, wherein the data strobe signal is toggled within an activation interval of the indication signal.

27. The circuit according to claim 24, wherein the indication signal is at latest activated simultaneously with a first valid data of the data and is at latest deactivated simultaneously with a last valid data of the data.

28. The circuit according to claim 24, wherein the indication signal, the data strobe signal, and the data are transmitted to a memory controller for controlling the semiconductor memory device.

29. A system comprising:

a clock driver for generating a system clock;

a semiconductor memory device for operating in response to the system clock; and a memory controller for operating in response to the system clock and controlling the semiconductor memory device and interchanging data with the semiconductor memory device; and wherein the memory controller generates a first indication signal for indicating write data transmission, a first data strobe signal, and write data, and the semiconductor memory device receives the first indication signal, receives the first data strobe signal in response to the first indication signal, and inputs the write data in response to toggling of the first data strobe signal, during a write operation; and wherein the semiconductor memory device generates a second indication signal for indicating output of read data, a second data strobe signal, and read data and the memory controller receives the second indication signal, receives the second data strobe signal in response to the second indication signal, and inputs the read data in response to toggling of the second data strobe signal, during a read operation.

30. The system according to claim 29, wherein the first indication signal is activated during a predetermined interval including a valid interval of the write data.

31. The system according to claim 30, wherein the first data strobe signal is toggled within an activation interval of the first indication signal.

32. The system according to claim 29, wherein the first indication signal is at latest activated simultaneously with a first valid data of the write data and is at latest deactivated simultaneously with a last valid data of the write data.

33. The system according to claim 29, wherein the second indication signal is activated during a predetermined interval including a valid interval of the read data.

34. The system according to claim 30, wherein the second data strobe signal is toggled within an activation interval of the second indication signal.

35. The system according to claim 29, wherein the second indication signal is at latest activated simultaneously with a first valid data of the read data and is at latest deactivated simultaneously with a last valid data of the read data.

* * * * *